US012615916B2

(12) United States Patent
Kim et al.

(10) Patent No.: US 12,615,916 B2
(45) Date of Patent: Apr. 28, 2026

(54) DISPLAY DEVICE

(71) Applicant: Samsung Display Co., LTD., Yongin-si (KR)

(72) Inventors: Sunkwang Kim, Yongin-si (KR); Shoyeon Kim, Yongin-si (KR); Hyungjin Song, Yongin-si (KR); Jaehyun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 336 days.

(21) Appl. No.: 18/244,278

(22) Filed: Sep. 10, 2023

(65) Prior Publication Data

US 2024/0121982 A1 Apr. 11, 2024

(30) Foreign Application Priority Data

Oct. 11, 2022 (KR) ........................ 10-2022-0129753

(51) Int. Cl.
| | |
|---|---|
| *H01L 29/08* | (2006.01) |
| *H10K 59/121* | (2023.01) |
| *H10K 59/131* | (2023.01) |

(52) U.S. Cl.
CPC ..... *H10K 59/1213* (2023.02); *H10K 59/1216* (2023.02); *H10K 59/1315* (2023.02)

(58) Field of Classification Search
CPC ........... H10K 59/1213; H10K 59/1216; H10K 59/1315
USPC ....................................................... 257/40
See application file for complete search history.

(56) References Cited

U.S. PATENT DOCUMENTS

| | | | |
|---|---|---|---|
| 9,324,740 B2 | 4/2016 | Lee et al. | |
| 10,481,690 B2 | 11/2019 | Cieplinski et al. | |
| 2020/0027900 A1* | 1/2020 | Ebihara .............. | H10D 86/0231 |
| 2021/0202659 A1 | 7/2021 | Lee et al. | |
| 2021/0408441 A1 | 12/2021 | Lee et al. | |
| 2022/0085134 A1 | 3/2022 | Jang et al. | |
| 2022/0199037 A1 | 6/2022 | Lee et al. | |

FOREIGN PATENT DOCUMENTS

| | | | | | |
|---|---|---|---|---|---|
| CN | 113363283 A | * | 9/2021 | ........ | H10K 59/8731 |
| KR | 102124025 B1 | | 6/2020 | | |
| KR | 1020210086441 A | | 7/2021 | | |
| KR | 1020210158617 A | | 12/2021 | | |
| KR | 1020220034330 A | | 3/2022 | | |
| KR | 1020220087665 A | | 6/2022 | | |

* cited by examiner

*Primary Examiner* — Phuc T Dang
(74) *Attorney, Agent, or Firm* — CANTOR COLBURN LLP

(57) ABSTRACT

A display device includes a transistor including an active layer and a gate electrode which overlaps a channel region of the active layer and includes at least one layer, a storage capacitor which includes a first capacitor electrode which is electrically connected to the transistor and disposed below the active layer and a second capacitor electrode over the first capacitor electrode, a connection layer connecting the second capacitor electrode and the active layer to each other, and a conductive pattern disposed between the storage capacitor and the transistor and including a material identical to a material of the at least one layer of the gate electrode.

20 Claims, 13 Drawing Sheets

DISPLAY DEVICE

This application claims priority to Korean Patent Application No. 10-2022-0129753, filed on Oct. 11, 2022, and all the benefits accruing therefrom under 35 U.S.C. § 119, the content of which in its entirety is herein incorporated by reference.

BACKGROUND

1. Field

Embodiments relate to a display device.

2. Description of the Related Art

As a field of displays visually representing various types of electrical signal information is being rapidly developed, various display devices having excellent characteristics, such as thinness, light weight, and low power consumption, are being introduced.

A display device may include a liquid crystal display device using light of a backlight without emitting light by itself, or a light-emitting display device including a display element capable of emitting light. The light-emitting display device may include display elements including an emission layer.

SUMMARY

Embodiments include a display device, and more particularly, a structure of a light-emitting display device.

Additional features will be set forth in part in the description which follows and, in part, will be apparent from the description, or may be learned by practice of the presented embodiments of the disclosure.

In an embodiment of the disclosure, a display device includes a transistor including an active layer and a gate electrode which overlaps a channel region of the active layer and includes at least one layer, a storage capacitor including a first capacitor electrode which is electrically connected to the transistor and disposed below the active layer and a second capacitor electrode over the first capacitor electrode, a connection layer connecting the second capacitor electrode and the active layer to each other, and a conductive pattern disposed between the storage capacitor and the transistor and including the same material as that of the at least one layer of the gate electrode.

In an embodiment, the connection layer may include a first portion between the second capacitor electrode and the conductive pattern and a second portion between the conductive pattern and the transistor. A hydrogen content of the first portion may be greater than a hydrogen content of the second portion.

In an embodiment, the second capacitor electrode, the connection layer, and the active layer may be unitary with one another.

In an embodiment, the display device may further include an insulating pattern between the connection layer and the conductive pattern.

In an embodiment, an opening may be defined in the insulating pattern between the storage capacitor and the transistor and expose at least a portion of the connection layer. The conductive pattern may contact the at least the portion of the connection layer exposed by the opening.

In an embodiment, at least a portion of the conductive pattern may be disposed in the opening.

In an embodiment, the at least the portion of the connection layer in contact with the conductive pattern may have a vertical thickness less than a vertical thickness of the second capacitor electrode.

In an embodiment, at least a portion of the conductive pattern may be disposed at a vertical level lower than that of the gate electrode.

In an embodiment, the conductive pattern may be spaced apart from the connection layer by the insulating pattern.

In an embodiment, at least a portion of the conductive pattern may be disposed at a same vertical level as that of the gate electrode. The conductive pattern may have the same stacked structure as the gate electrode.

In an embodiment, the gate electrode may include a first gate electrode layer, a second gate electrode layer on the first gate electrode layer, and a third gate electrode layer on the second gate electrode layer.

In an embodiment, the conductive pattern may include a first layer, a second layer on the first layer, and a third layer on the second layer. The first layer of the conductive pattern may include the same material as that of the first gate electrode layer.

In an embodiment, the second gate electrode layer may include the same material as that of the second layer of the conductive pattern, and the third gate electrode layer may include the same material as that of the third layer of the conductive pattern.

In an embodiment, the conductive pattern may include titanium (Ti).

In an embodiment, the display device may further include a passivation layer disposed on the gate electrode and the conductive pattern and including silicon nitride or silicon oxynitride.

In an embodiment, the gate electrode may receive a scan signal.

In an embodiment of the disclosure, a display device includes a transistor including an active layer and a gate electrode which overlaps a channel region of the active layer, a storage capacitor including a first capacitor electrode which is electrically connected to the transistor and disposed below the active layer and a second capacitor electrode over the first capacitor electrode, a connection layer unitary with the second capacitor electrode and the active layer and connecting the second capacitor electrode and the active layer to each other, a conductive pattern disposed between the storage capacitor and the transistor and having the same stacked structure as the gate electrode, and a passivation layer disposed on the gate electrode and the conductive pattern.

In an embodiment, the connection layer may include a first portion between the second capacitor electrode and the conductive pattern and a second portion between the conductive pattern and the transistor. A hydrogen content of the first portion may be greater than a hydrogen content of the second portion.

In an embodiment of the disclosure, a display device includes a first driving voltage line and a first common voltage line extending in a first direction on a substrate, a scan line extending in a second direction crossing the first driving voltage line and the first common voltage line, a switching transistor including an active layer and a gate electrode. The gate electrode overlaps a channel region of the active layer and is connected to the scan line, a storage capacitor electrically connected to the switching transistor and including a first capacitor electrode and a second capacitor electrode, and a conductive pattern disposed between the switching transistor and the storage capacitor.

BRIEF DESCRIPTION OF THE DRAWINGS

The above and other features and advantages of illustrative embodiments of the disclosure will be more apparent from the following description taken in conjunction with the accompanying drawings, in which:

FIG. 6A is a cross-sectional view of region A, taken along line II-II' of FIG. 5;

FIG. 8 is a cross-sectional view of region A, taken along line V-V' of FIG. 7.

DETAILED DESCRIPTION

Figure 1A:
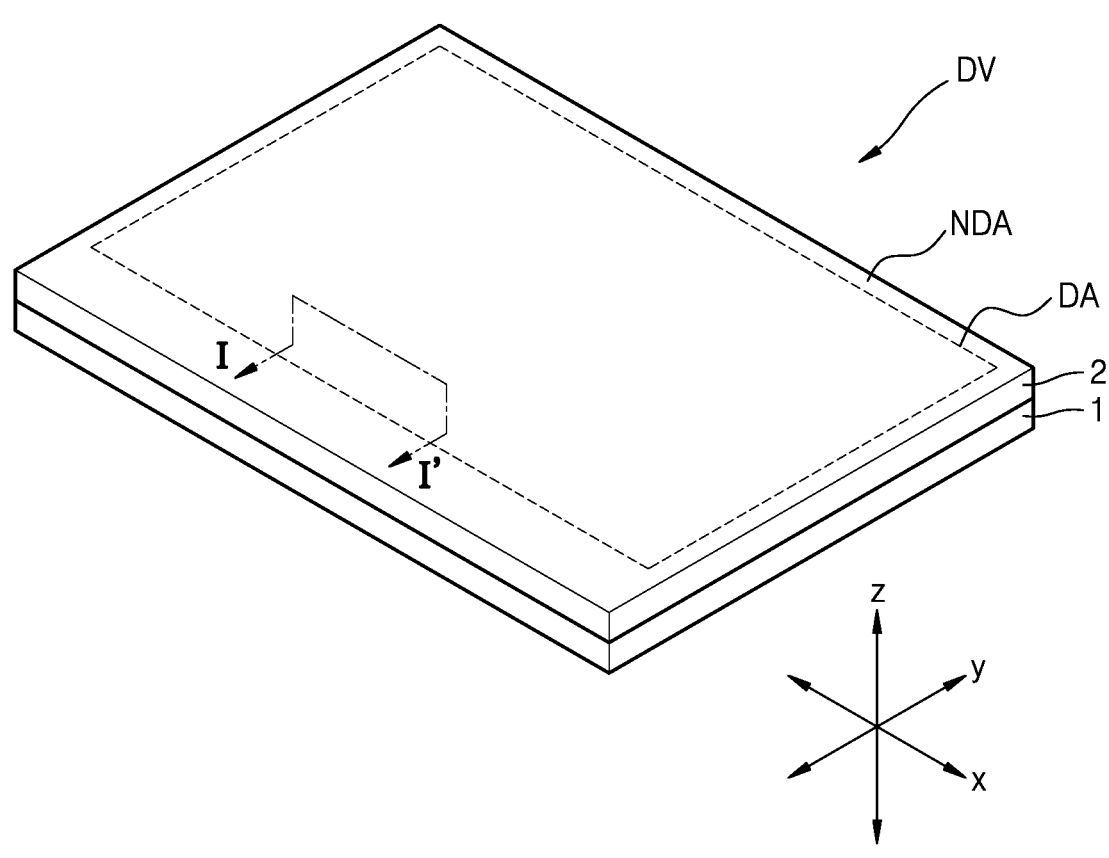
FIG. 1A is a schematic perspective view of an embodiment of a display device.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the description allows for various changes and numerous embodiments, illustrative embodiments will be illustrated in the drawings and described in the written description. Effects and features of embodiments and methods of accomplishing the same will become apparent from the following detailed description of the embodiments, taken in conjunction with the accompanying drawings. However, the illustrated embodiments may have different forms and should not be construed as being limited to the descriptions set forth herein.

Embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used only to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, intervening layers, regions, or elements, for example, may be present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When an embodiment may be implemented differently, a predetermined process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1B:
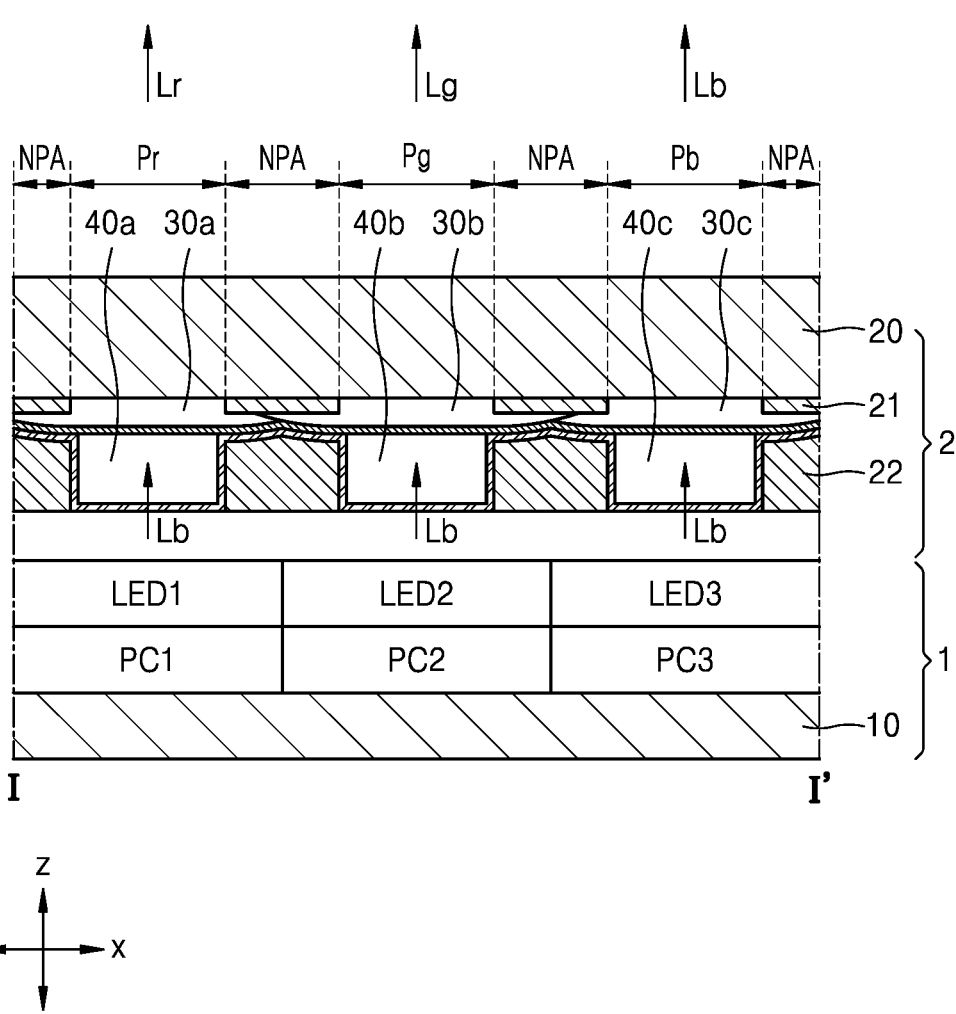
FIG. 1B is a cross-sectional view of an embodiment of a display device, taken along line I-I' of FIG. 1A.
Figure 1C:
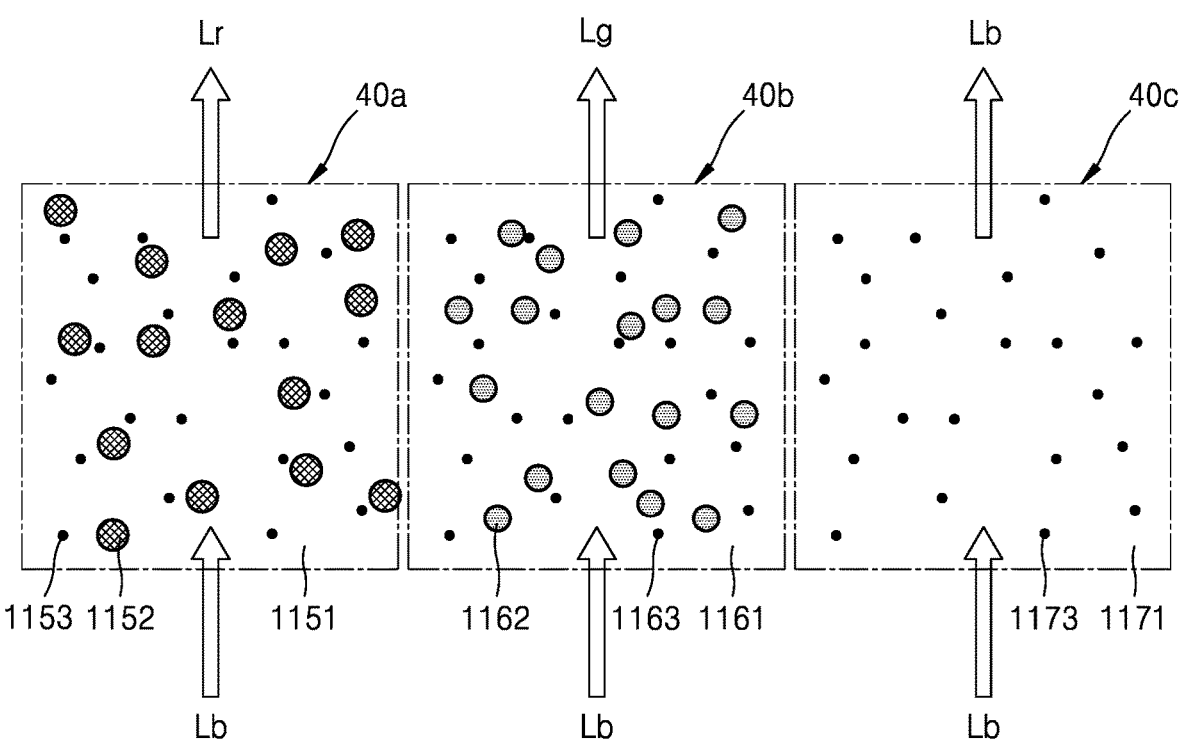
FIG. 1C shows each portion of a color conversion-transmission layer of FIG. 1B.

FIG. 1A is a schematic perspective view of an embodiment of a display device DV. FIG. 1B is a cross-sectional view of an embodiment of the display device DV, taken along line I-I' of FIG. 1A. FIG. 1C shows each portion of a color conversion-transmission layer of FIG. 1B.

Each pixel of the display device DV is an area where light of a predetermined color may be emitted, and the display device DV may provide an image by light emitted from pixels. In an embodiment, each pixel may emit red, green, or blue light.

A non-display area NDA is an area where no image is provided, and may surround an entirety of the display area DA. A driver or a main power line for providing electrical signals or power to pixel circuits may be disposed in the non-display area NDA. The non-display area NDA may include a pad, which is an area to which an electronic device or a printed circuit board may be electrically connected.

As shown in FIG. 1A, the display area DA may have a polygonal shape including a quadrilateral shape. In an embodiment, the display area DA may have a rectangular shape having a horizontal length greater than a vertical length, a rectangular shape having a horizontal length less than a vertical length, or a square shape. In an alternative embodiment, the display area DA may have various shapes, such as an oval shape or a circular shape.

Referring to FIG. 1B, in some embodiments, the display device may include a light-emitting panel 1 (or a light-emitting unit) and a color panel 2 (or a color unit) stacked in a thickness direction (a direction z) of the display device. The light-emitting panel 1 may include first to third pixel circuits PC1 to PC3 on a first substrate 10, and first to third light-emitting diodes LED1 to LED3 respectively connected thereto.

While passing through the color panel 2, light (e.g., blue light Lb) emitted from the first to third light-emitting diodes LED1 to LED3 may be converted into red light Lr, green light Lg, and blue light Lb or may be transmitted. An area where the red light Lr is emitted may correspond to a red pixel Pr, an area where the green light Lg is emitted may correspond to a green pixel Pg, and an area where the blue light Lb is emitted may correspond to a blue pixel Pb.

The color panel 2 may include a color conversion-transmission layer including a first color conversion portion 40a, a second color conversion portion 40b, and a transmission portion 40c, and a color layer including a first color filter 30a, a second color filter 30b, and a third color filter 30c.

A first color area of the color panel 2 may include the first color conversion portion 40a and the first color filter 30a overlapping each other, a second color area may include the second color conversion portion 40b and the second color filter 30b overlapping each other, and a third color area may include the transmission portion 40c and the third color filter 30c overlapping each other.

The color panel 2 may include a non-pixel area NPA surrounding each of the first to third color areas. The non-pixel area NPA may be a light-blocking area. The light-blocking area may include a first light-blocking layer 21 on a second substrate 20. The first light-blocking layer 21 may include a plurality of holes defined by removing portions corresponding to the red pixel Pr, the green pixel Pg, and the blue pixel Pb. The first light-blocking layer 21 may be in the non-pixel area NPA, and may include various materials capable of absorbing light.

The light-blocking area may include a second light-blocking layer 22 over the first light-blocking layer 21. The second light-blocking layer 22 may also be in the non-pixel area NPA. The second light-blocking layer 22 may include various materials capable of absorbing light. The second light-blocking layer 22 may include the same material as that of the first light-blocking layer 21 described above, or may include a different material from the first light-blocking layer 21. The first light-blocking layer 21 and/or the second light-blocking layer 22 may include an opaque inorganic insulating material, such as chromium oxide or molybdenum oxide, or an opaque organic insulating material, such as black resin.

Blue light Lb emitted from the first light-emitting diode LED1 of the light-emitting panel 1 may pass through the first color area of the color panel 2. While passing through the color panel 2, the blue light Lb may be converted into red light Lr and filtered. The first color conversion portion 40a and the first color filter 30a included in the first color area overlap the first light-emitting diode LED1. The blue light Lb emitted from the first light-emitting diode LED1 may be converted in the first color conversion portion 40a and then may pass through the first color filter 30a.

The first color conversion portion 40a may convert incident blue light Lb into red light Lr. As shown in FIG. 1C, the first color conversion portion 40a may include a first photosensitive polymer 1151, and first quantum dots 1152 and first scattering particles 1153 dispersed in the first photosensitive polymer 1151.

The first quantum dots 1152 may be excited by the blue light Lb to isotropically emit the red light Lr having a wavelength longer than a wavelength of the blue light Lb. The first photosensitive polymer 1151 may be a light-transmissive organic material. The first scattering particles 1153 may scatter any portion of the blue light Lb that is not initially absorbed by the first quantum dots 1152 and thus may allow more first quantum dots 1152 to be excited, thereby increasing color conversion efficiency. The first scattering particles 1153 may include titanium oxide ($TiO_2$) or metal particles, for example. The first quantum dots 1152 may include a group II-VI compound, a group III-V compound, a group IV-VI compound, a group IV element, a group IV compound, or any combinations thereof.

More specifically, in the description, quantum dots (e.g., the first quantum dots 1152, second quantum dots 1162) refer to crystals of a semiconductor compound, and may include any material capable of emitting light of various emission wavelengths according to sizes of crystals.

The quantum dots may have a diameter of, e.g., about 1 nanometer (nm) to about 10 nm.

The quantum dots may be synthesized by a wet chemical process, a metal organic chemical vapor deposition ("MOCVD") process, a molecular beam epitaxy ("MBE") process, or a similar process. The wet chemical process is a method of growing quantum dot particle crystals after mixing an organic solvent with a precursor material. When the crystals are grown, the organic solvent naturally serves as a dispersant coordinated on the surface of quantum dot crystals and controls the growth of the crystals, and thus, the growth of quantum dot particles may be controlled through an easy and low-cost process compared to a vapor deposition method, such as MOCVD or MBE.

The quantum dots may include a group II-VI semiconductor compound, a group III-V semiconductor compound, a group III-VI semiconductor compound, a group semiconductor compound, a group IV-VI semiconductor compound, a group IV element or compound, or any combinations thereof.

In embodiments, the group II-VI semiconductor compound may include a binary compound, such as CdS, CdSe, CdTe, ZnS, ZnSe, ZnTe, ZnO, HgS, HgSe, HgTe, MgSe, or MgS, a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound, such as CdZnSeS, CdZnSeTe, CdZnSTe, CdHgSeS, CdHgSeTe, CdHgSTe, HgZnSeS, HgZnSeTe, or HgZnSTe, or any combinations thereof.

In embodiments, the group III-V semiconductor compound may include a binary compound, such as GaN, GaP, GaAs, GaSb, AlN, AlP, AlAs, AlSb, InN, InP, InAs, or InSb, a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb, a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combinations thereof. The group III-V semiconductor compound may further include a group II element. In embodiments, the group III-V semiconductor compound further including a group II element may include InZnP, InGaZnP, or InAlZnP.

In embodiments, the group III-VI semiconductor compound may include a binary compound, such as GaS, GaSe, Ga2Se3, GaTe, InS, In2S3, InSe, In2Se3, or InTe, a ternary compound, such as AgInS, AgInS2, CuInS, CuInS2, InGaS3, or InGaSe3, or any combinations thereof.

In embodiments, the group semiconductor compound may include a ternary compound, such as AgInS, AgInS2, CuInS, CuInS2, CuGaO2, AgGaO2, or AgAlO2, or any combinations thereof.

In embodiments, the group IV-VI semiconductor compound may include a binary compound, such as SnS, SnSe, SnTe, PbS, PbSe, or PbTe, a ternary compound, such as SnSeS, SnSeTe, SnSTe, PbSeS, PbSeTe, PbSTe, SnPbS, SnPbSe, or SnPbTe, a quaternary compound, such as SnPbSSe, SnPbSeTe, or SnPbSTe, or any combinations thereof.

In embodiments, the group IV element or compound may include a single-element compound, such as Si or Ge, a binary compound, such as SiC or SiGe, or any combinations thereof.

Each element included in a multi-element compound, such as the binary compound, the ternary compound, or the quaternary compound, may be in particles at a uniform concentration or a non-uniform concentration.

The quantum dots may have a single structure or a core-shell dual structure, in which the concentration of each element included in the corresponding quantum dot is uniform. In an embodiment, a material included in the core and a material included in the shell may be different from each other, for example. The shell of the quantum dots may serve as a protective layer for maintaining semiconductor properties by preventing chemical degeneration of the core and/or a charging layer for imparting electrophoretic properties to the quantum dots. The shell may have a single-layer or multi-layer structure. An interface between the core and the shell may have a concentration gradient in which the concentration of elements present in the shell decreases toward the center of core.

In embodiments, the shell of the quantum dots may include metal or non-metal oxide, a semiconductor compound, or any combinations thereof. In embodiments, the metal or non-metal oxide may include a binary compound, such as SiO2, Al2O3, TiO2, ZnO, MnO, Mn2O3, Mn3O4, CuO, FeO, Fe2O3, Fe3O4, CoO, Co3O4, or NiO, a ternary compound, such as MgAl2O4, CoFe2O4, NiFe2O4, or CoMn2O4, or any combinations thereof. In embodiments, the semiconductor compound may include a group II-VI semiconductor compound, a group III-V semiconductor compound, a group III-VI semiconductor compound, a group I-III-VI semiconductor compound, a group IV-VI semiconductor compound, or any combinations thereof, as described above. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combinations thereof.

The quantum dots may have a full width of half maximum ("FWHM") of an emission wavelength spectrum in a range of about 45 nm or less, specifically about 40 nm or less, and more specifically about 30 nm or less, and color purity or color reproducibility may be improved in the above-described range. In addition, a wide viewing angle may be improved because light emitted through the quantum dots is emitted in all directions.

The shape of the quantum dots may be spherical, pyramidal, multi-arm, or cubic nanoparticles, nanotubes, nanowires, nanofibers, or nanoplatelet particles, for example.

An energy band gap may be adjusted by adjusting sizes of the quantum dots, and thus, light in various wavelength bands may be obtained through a quantum dot emission layer. Accordingly, a light-emitting element emitting light of various wavelengths may be implemented by the quantum dots having different sizes from each other. Specifically, sizes of the quantum dots may be selected to emit red light, green light and/or blue light. In addition, sizes of the quantum dots may emit white light by combining light of various colors.

The red light Lr converted by the first color conversion portion 40a may have color purity improved while passing through the first color filter 30a. The first color filter 30a may include a pigment or dye of a first color (e.g., red).

Blue light Lb emitted from the second light-emitting diode LED2 of the light-emitting panel 1 may pass through the second color area of the color panel 2. While passing through the color panel 2, the blue light Lb may be converted into green light Lg and filtered. The second color conversion portion 40b and the second color filter 30b included in the second color area overlap the second light-emitting diode LED2. The blue light Lb emitted from the second light-emitting diode LED2 may be converted in the second color conversion portion 40b and then may pass through the second color filter 30b.

The second color conversion portion 40b may convert incident blue light Lb into green light Lg. The second color conversion portion 40b may overlap the second color filter 30b. As shown in FIG. 1C, the second color conversion portion 40b may include a second photosensitive polymer 1161, and the second quantum dots 1162 and second scattering particles 1163 dispersed in the second photosensitive polymer 1161.

The second quantum dots 1162 may be excited by the blue light Lb to isotropically emit the green light Lg having a wavelength longer than a wavelength of the blue light Lb. The second photosensitive polymer 1161 may be a light-transmissive organic material.

The second scattering particles 1163 may scatter any portion of the blue light Lb that is not initially absorbed by the second quantum dots 1162 and thus may allow more second quantum dots 1162 to be excited, thereby increasing color conversion efficiency. The second scattering particles 1163 may include titanium oxide (TiO2) or metal particles, for example. The second quantum dots 1162 may include a group II-VI compound, a group III-V compound, a group IV-VI compound, a group IV element, a group IV compound, or any combinations thereof.

In some embodiments, the first quantum dots 1152 and the second quantum dots 1162 may include the same material as each other. In this case, the first quantum dots 1152 may be greater than the second quantum dots 1162 in size.

The green light Lg converted by the second color conversion portion 40b may have color purity improved while passing through the second color filter 30b. The second color filter 30b may include a pigment or dye of a second color (e.g., green).

Blue light Lb emitted from the third light-emitting diode LED3 of the light-emitting panel 1 may pass through the third color area of the color panel 2. The transmission portion 40c and the third color filter 30c included in the third color area overlap the third light-emitting diode LED3. The blue light Lb emitted from the third light-emitting diode LED3 may pass through the transmission portion 40c without color conversion and then may be emitted to the outside through the third color filter 30c.

Without converting blue light Lb incident on the transmission portion 40c, the transmission portion 40c may transmit the blue light Lb. As shown in FIG. 1C, the transmission portion 40c may include a third photosensitive polymer 1171 in which third scattering particles 1173 are dispersed. The third photosensitive polymer 1171 may be a light-transmissive organic material, such as silicone resin, epoxy resin, etc., and may include the same material as that of the first and second photosensitive polymers 1151 and 1161. The third scattering particles 1173 may scatter and emit the blue light Lb and may include the same material as that of the first and second scattering particles 1153 and 1163.

The blue light Lb having passed through the transmission portion 40c may have color purity improved while passing through the third color filter 30c.

Each of the first to third light-emitting diodes LED1 to LED3 may include an organic light-emitting diode including an organic material. In another embodiment, each of the first to third light-emitting diodes LED1 to LED3 may be an inorganic light-emitting diode including an inorganic material. The inorganic light-emitting diode may include a PN junction diode including inorganic semiconductor-based materials. When a voltage is applied to the PN junction diode in a forward direction, holes and electrons are injected, and light of a predetermined color may be emitted by converting energy generated by recombination of holes and electrons into light energy. The above-described inorganic light-emitting diode may have a width of several micrometers to hundreds of micrometers or several nanometers to hundreds of nanometers. In some embodiments, each of the first to third light-emitting diodes LED1 to LED3 may be a light-emitting diode including quantum dots. As described above, an emission layer of each of the first to third light-emitting diodes LED1 to LED3 may include an organic material, an inorganic material, quantum dots, an organic material and quantum dots, or an inorganic material and quantum dots.

A display device DV having the above-described structure may include a mobile phone, a television, a billboard, a monitor, a tablet personal computer, a notebook computer, etc.

Figure 2:
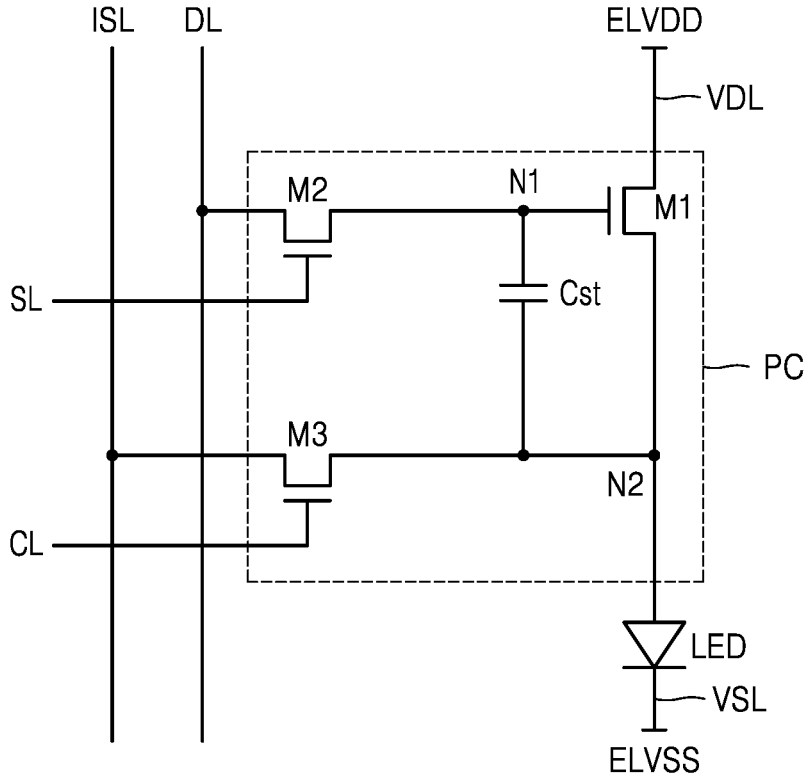
FIG. 2 is an equivalent circuit diagram showing an embodiment of a light-emitting diode and a pixel circuit electrically connected to the light-emitting diode, which are included in a light-emitting panel of a display device.

FIG. 2 is an equivalent circuit diagram showing an embodiment of a light-emitting diode LED and a pixel circuit PC electrically connected to the light-emitting diode LED, which are included in a light-emitting panel of a display device.

Referring to FIG. 2, a first electrode (e.g., an anode) of a light-emitting diode, e.g., the light-emitting diode LED, may be connected to the pixel circuit PC, and a second electrode (e.g., a cathode) of the light-emitting diode LED may be connected to a common voltage line VSL which provides a common power voltage ELVSS. The light-emitting diode LED may emit light at a luminance corresponding to a current supplied from the pixel circuit PC.

The light-emitting diode LED of FIG. 2 may correspond to each of the first to third light-emitting diodes LED1 to LED3 shown in FIG. 1B, and the pixel circuit PC of FIG. 2 may correspond to each of the first to third pixel circuits PC1 to PC3 shown in FIG. 1B.

The pixel circuit PC may control an amount of current flowing from a driving power voltage ELVDD to the common power voltage ELVSS via the light-emitting diode LED in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor thin-film transistor including a semiconductor layer composed of an oxide semiconductor, or a silicon semiconductor thin-film transistor including a semiconductor layer composed of polysilicon. Depending on the type of a transistor, a first electrode may be one of a source electrode and a drain electrode, and a second electrode may be the other of the source electrode and the drain electrode.

The first transistor M1 may be a driving transistor. A first electrode of the first transistor M1 may be connected to a driving voltage line VDL which supplies the driving power voltage ELVDD, and a second electrode of the first transistor M1 may be connected to a first electrode of the light-emitting diode LED. A gate electrode of the first transistor M1 may be connected to a first node N1. The first transistor M1 may control an amount of current flowing through the light-emitting diode LED from the driving power voltage ELVDD in response to a voltage of the first node N1.

The second transistor M2 may be a switching transistor. A first electrode of the second transistor M2 may be connected to a data line DL, and a second electrode of the second transistor M2 may be connected to the first node N1. A gate electrode of the second transistor M2 may be connected to a scan line SL. When a scan signal is supplied to the second transistor M2 via the scan line SL, the second transistor M2 may be turned on to electrically connect the data line DL and the first node N1 to each other.

The third transistor M3 may be an initialization transistor and/or a sensing transistor. A first electrode of the third transistor M3 may be connected to a second node N2, and a second electrode of the third transistor M3 may be connected to a sensing line ISL. A gate electrode of the third transistor M3 may be connected to a control line CL.

When a control signal is supplied to the third transistor M3 via the control line CL, the third transistor M3 may be turned on to electrically connect the sensing line ISL and the second node N2 to each other. In some embodiments, the third transistor M3 may be turned on according to a signal received through the control line CL to transfer an initialization voltage from the sensing line ISL to the first electrode of the light-emitting diode LED and initialize the first electrode of the light-emitting diode LED. In some embodiments, when a control signal is supplied to the third transistor M3 via the control line CL, the third transistor M3 may be turned on to sense characteristic information of the light-emitting diode LED. The third transistor M3 may have both of the above-described functions as an initialization transistor and a sensing transistor or may have either function.

In some embodiments, an initialization operation and a sensing operation of the third transistor M3 may each be performed individually or may be performed simultane-
ously. Hereinafter, a case in which a third transistor has both
the functions of an initialization transistor and a sensing
transistor will be described for convenience.

The storage capacitor Cst may be connected between the
first node N1 and the second node N2. In an embodiment, a
first capacitor electrode of the storage capacitor Cst may be
connected to the gate electrode of the first transistor M1, and
a second capacitor electrode of the storage capacitor Cst
may be connected to the first electrode of the light-emitting
diode LED, for example.

Although the first transistor M1, the second transistor M2,
and the third transistor M3 are shown as N-type metal-
oxide-semiconductor ("NMOS") in FIG. 2, the disclosure is
not limited thereto. In an embodiment, at least one of the first
transistor M1, the second transistor M2, and the third
transistor M3 may be P-type metal-oxide-semiconductor
("PMOS"), for example. In addition, although three transis-
tors are shown in FIG. 2, the disclosure is not limited thereto.
The pixel circuit PC may include four or more transistors.

Figure 3:
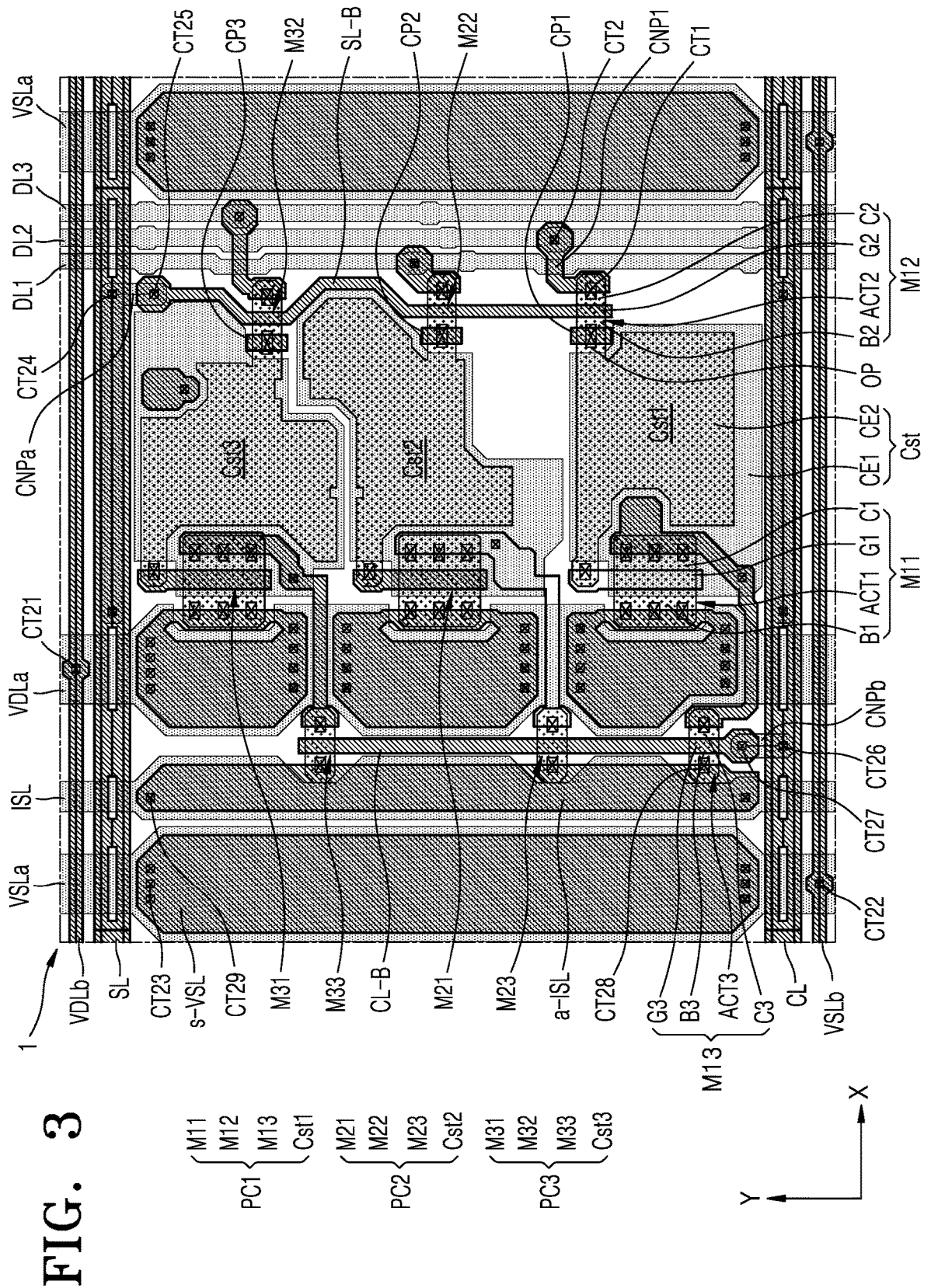
FIG. 3 is a plan view showing an embodiment of pixel circuits of a light-emitting panel.
Figure 4:
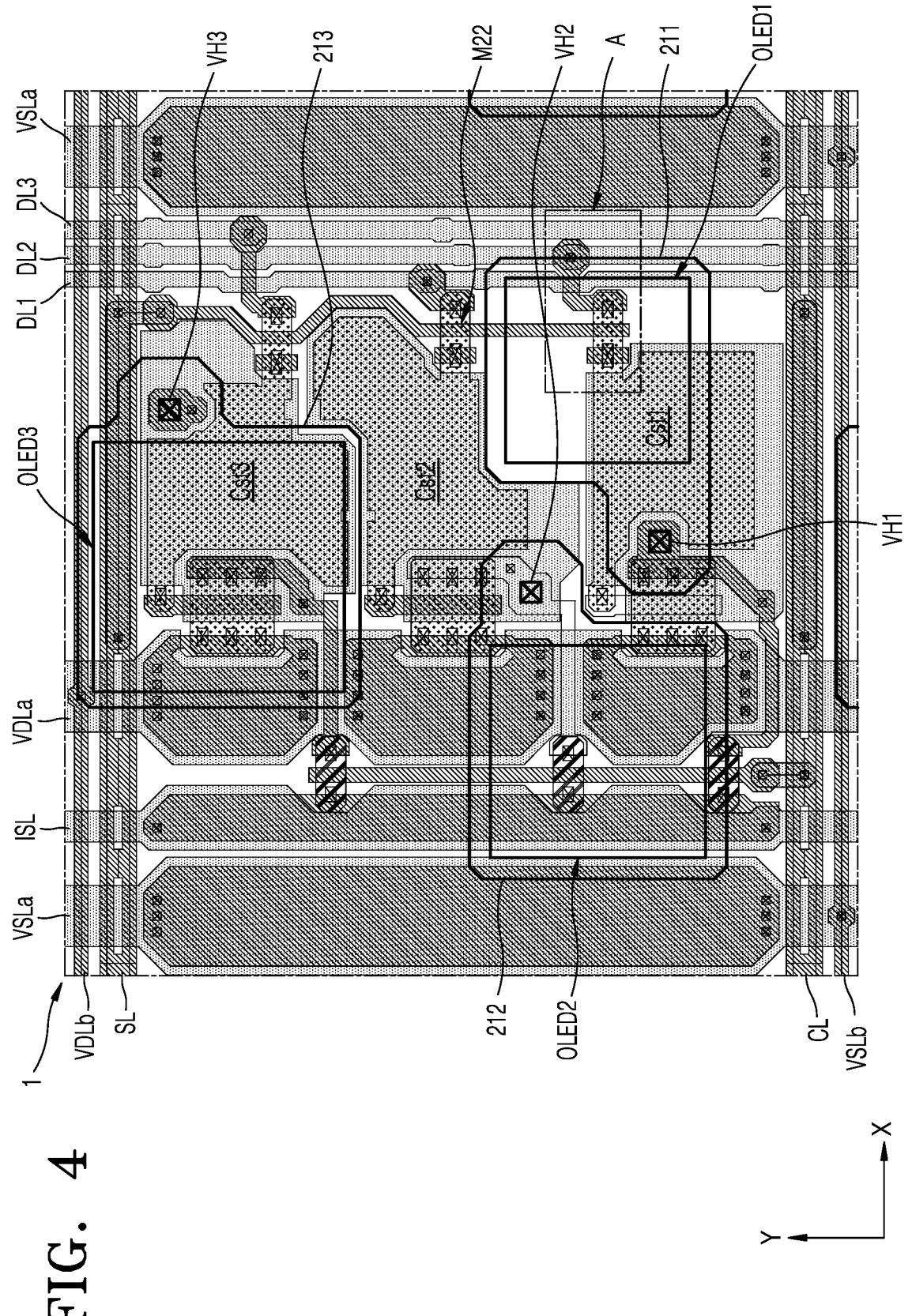
FIG. 4 is a plan view showing light-emitting diodes disposed on the pixel circuits of FIG. 3.

FIG. 3 is a plan view showing an embodiment of pixel
circuits of the light-emitting panel 1. FIG. 4 is a plan view
showing light-emitting diodes disposed on the pixel circuits
of FIG. 3. FIG. 4 illustrates an embodiment in which the
light-emitting diodes are organic light-emitting diodes.

Referring to FIGS. 3 and 4, the scan line SL and the
control line CL may extend in a direction x, and first to third
data lines DL1 to DL3 may extend in a direction y crossing
the direction x. In addition, the sensing line ISL, a first
driving voltage line VDLa, and a first common voltage line
VSLa may extend in the direction y, and a second driving
voltage line VDLb and a second common voltage line VSLb
may extend in the direction x.

Two adjacent first common voltage lines VSLa may be
apart from each other, and the first to third data lines DL1 to
DL3, the sensing line ISL, and the first driving voltage line
VDLa may be arranged between the above-described two
adjacent first common voltage lines VSLa. The sensing line
ISL and the first driving voltage line VDLa may be adjacent
to one first common voltage line VSLa while neighboring
each other. The first to third data lines DL1 to DL3 may be
adjacent to the other first common voltage line VSLa while
neighboring one another. In an embodiment, the sensing line
ISL and the first driving voltage line VDLa may be arranged
on one side (e.g., the left side) of first to third storage
capacitors Cst1 to Cst3 described below, and the first to third
data lines DL1 to DL3 may be arranged on the other side
(e.g., the right side), for example. Through this structure,
space of a light-emitting panel 1 may be efficiently used.

The second driving voltage line VDLb may cross the first
driving voltage line VDLa and extend in the direction x. The
second common voltage line VSLb may cross the first
driving voltage line VDLa and extend in the direction x. The
second driving voltage line VDLb and the second common
voltage line VSLb may be apart from each other with the
first to third storage capacitors Cst1 to Cst3 therebetween.

The second driving voltage line VDLb may be adjacent to
the scan line SL, and the second common voltage line VSLb
may be adjacent to the control line CL. The second driving
voltage line VDLb may be connected to the first driving
voltage line VDLa through a contact hole CT21, and the
second common voltage line VSLb may be connected to the
first common voltage line VSLa through a contact hole
CT22.

The light-emitting panel 1 may include a structure in
which the structure shown in FIG. 3 is repeated in the
direction x and the direction y, and accordingly, a plurality of first driving voltage lines VDLa and a plurality of second
driving voltage lines VDLb included in the light-emitting
panel 1 may have a mesh structure in a plan view. Likewise,
a plurality of first common voltage lines VSLa and a
plurality of second common voltage lines VSLb may have a
mesh structure in a plan view.

The first common voltage line VSLa may overlap a
sub-common voltage line s-VSL. The first common voltage
line VSLa may be electrically connected to the sub-common
voltage line s-VSL. In an embodiment, the first common
voltage line VSLa may be connected to the sub-common
voltage line s-VSL through a contact hole CT23, for
example.

The sub-common voltage line s-VSL may be disposed
between the scan line SL and the control line CL and may
have a length less than a distance (a distance in the direction
y) between the scan line SL and the control line CL. The
sub-common voltage line s-VSL is formed to reduce self-
resistance of the first common voltage line VSLa and may be
disposed in the same layer as gate electrodes of transistors
or the scan line SL.

In a plan view, transistors and storage capacitors may be
arranged in an approximately quadrangular space sur-
rounded by the neighboring first common voltage lines
VSLa, the second driving voltage line VDLb, and the second
common voltage line VSLb. The transistors and the storage
capacitors may be electrically connected to corresponding
light-emitting diodes, respectively. In this regard, it is shown
in FIG. 4 that first electrodes 211, 212, and 213 of first to
third organic light-emitting diodes OLED1 to OLED3 are
electrically connected to corresponding pixel circuits,
respectively.

As shown in FIG. 4, the first electrode 211 of the first
organic light-emitting diode OLED1 may be electrically
connected to the first pixel circuit PC1. As shown in FIG. 3,
the first pixel circuit PC1 may include a first driving tran-
sistor M11, a first switching transistor M12, a first sensing
transistor M13, and the first storage capacitor Cst1. In an
embodiment, the first electrode 211 of the first organic
light-emitting diode OLED1 may be electrically connected
to the first pixel circuit PC1 through a first via hole VH1, but
the disclosure is not limited thereto.

The first electrode 212 of the second organic light-
emitting diode OLED2 may be electrically connected to the
second pixel circuit PC2, and the second pixel circuit PC2
may include a second driving transistor M21, a second
switching transistor M22, a second sensing transistor M23,
and the second storage capacitor Cst2. In an embodiment,
the first electrode 212 of the second organic light-emitting
diode OLED2 may be electrically connected to the second
pixel circuit PC2 through a second via hole VH2, but the
disclosure is not limited thereto.

The first electrode 213 of the third organic light-emitting
diode OLED3 may be electrically connected to the third
pixel circuit PC3, and the third pixel circuit PC3 may
include a third driving transistor M31, a third switching
transistor M32, a third sensing transistor M33, and the third
storage capacitor Cst3. In an embodiment, the first electrode
213 of the third organic light-emitting diode OLED3 may be
electrically connected to the third pixel circuit PC3 through
a third via hole VH3, but the disclosure is not limited
thereto.

The first to third storage capacitors Cst1 to Cst3 may be
arranged in the direction y. The first storage capacitor Cst1
may be relatively closest to the control line CL, the third
storage capacitor Cst3 may be relatively closest to the scan line SL, and the second storage capacitor Cst2 may be disposed between the first storage capacitor Cst1 and the third storage capacitor Cst3.

Each of the first to third driving transistors M11 to M31, the first to third switching transistors M12 to M32, and the first to third sensing transistors M13 to M33 may include an active layer and a gate electrode.

The first driving transistor M11 may include a first active layer ACT1 and a first gate electrode G1. The first active layer ACT1 may include an oxide semiconductor or a silicon-based semiconductor. The first active layer ACT1 may include a first low-resistance region B1 and a second low-resistance region C1, and a channel region may be disposed between the first low-resistance region B1 and the second low-resistance region C1. The first low-resistance region B1 and the second low-resistance region C1 are regions having a resistance less than that of the channel region and may be formed through an impurity doping process or a conductive process. The first gate electrode G1 may overlap the channel region of the first active layer ACT1. One of the first low-resistance region B1 and the second low-resistance region C1 may correspond to a source region, and the other may correspond to a drain region.

The first gate electrode G1 of the first driving transistor M11 may be electrically connected to the first storage capacitor Cst1. The first low-resistance region B1 of the first active layer ACT1 may be electrically connected to the first driving voltage line VDLa. The second low-resistance region C1 of the first active layer ACT1 may be electrically connected to the first electrode 211 of the first organic light-emitting diode OLED1.

The first switching transistor M12 may include a second active layer ACT2 and a second gate electrode G2. The second active layer ACT2 may include an oxide semiconductor or a silicon-based semiconductor. The second active layer ACT2 may include a first low-resistance region B2 and a second low-resistance region C2, and a channel region may be disposed between the first low-resistance region B2 and the second low-resistance region C2. The first low-resistance region B2 and the second low-resistance region C2 are regions having a resistance less than that of the channel region and may be formed through an impurity doping process or a conductive process. In an embodiment, because the first low-resistance region B2 and the second low-resistance region C2 do not overlap a second insulating pattern 105b, the first low-resistance region B2 and the second low-resistance region C2 may be made conductive by a subsequent process after a process operation of forming a connection layer CNL, a second capacitor electrode CE2, and the second gate electrode G2. The second gate electrode G2 may overlap the channel region of the second active layer ACT2. The second gate electrode G2 of the first switching transistor M12 may correspond to a portion of a branch (hereinafter also referred to as a first branch SL-B) extending in a direction crossing the scan line SL. The second gate electrode G2 of the first switching transistor M12 may receive a scan signal through the scan line SL.

The scan line SL may be electrically connected to gate electrodes of the first to third switching transistors M12 to M32. The first branch SL-B may extend in the direction y. Portions of the first branch SL-B may correspond to gate electrodes of the first to third switching transistors M12 to M32. The first branch SL-B may extend between a group of the first to third storage capacitors Cst1 to Cst3 and a group of the first to third data lines DL1 to DL3. The first branch SL-B may be electrically connected to the scan line SL by a connection pattern CNPa. In an embodiment, the scan line SL may be connected to the connection pattern CNPa through a contact hole CT24, and the connection pattern CNPa may be connected to the first branch SL-B through a contact hole CT25, for example.

One of the first low-resistance region B2 and the second low-resistance region C2 of the first switching transistor M12 may be electrically connected to the second data line DL2, and the other may be electrically connected to the first storage capacitor Cst1. In an embodiment, the first low-resistance region B2 of the second active layer ACT2 may be connected to the second capacitor electrode CE2 of the first storage capacitor Cst1 in the same layer, for example. In an embodiment, the second low-resistance region C2 of the second active layer ACT2 may be connected to a connection pattern CNP1 through a contact hole CT1, and the connection pattern CNP1 may be connected to the second data line DL2 through a contact hole CT2, for example. Accordingly, the second low-resistance region C2 of the second active layer ACT2 may be electrically connected to the second data line DL2 by the connection pattern CNP1.

The first sensing transistor M13 may include a third active layer ACT3 and a third gate electrode G3. The third active layer ACT3 may include an oxide semiconductor or a silicon-based semiconductor. The third active layer ACT3 may include a first low-resistance region B3 and a second low-resistance region C3, and a channel region may be disposed between the first low-resistance region B3 and the second low-resistance region C3. The first low-resistance region B3 and the second low-resistance region C3 are regions having a resistance less than that of the channel region and may be formed through an impurity doping process or a conductive process. The third gate electrode G3 may overlap the channel region of the third active layer ACT3.

The control line CL may be electrically connected to gate electrodes of the first to third sensing transistors M13 to M33. A second branch CL-B may extend in the direction y. Portions of the second branch CL-B may correspond to gate electrodes of the first to third sensing transistors M13 to M33. The second branch CL-B may extend between the first driving voltage line VDLa and the sensing line ISL. The second branch CL-B may be electrically connected to the control line CL by a connection pattern CNPb. In an embodiment, the control line CL may be connected to the connection pattern CNPb through a contact hole CT26, and the connection pattern CNPb may be connected to the second branch CL-B through a contact hole CT27, for example.

One of the first low-resistance region B3 and the second low-resistance region C3 of the third active layer ACT3 may be electrically connected to the sensing line ISL, and the other may be electrically connected to the first storage capacitor Cst1. In an embodiment, the first low-resistance region B3 of the third active layer ACT3 may be connected to an auxiliary sensing line a-ISL through a contact hole CT28, and the auxiliary sensing line a-ISL may be connected to the sensing line ISL through a contact hole CT29, for example. Accordingly, the first low-resistance region B3 may be electrically connected to the sensing line ISL through the auxiliary sensing line a-ISL. The auxiliary sensing line a-ISL may extend in an extension direction (the direction y) of the sensing line ISL while overlapping the sensing line ISL. In a plan view, the auxiliary sensing line a-ISL may be disposed between the scan line SL and the control line CL and may have a length less than a distance (a distance in the direction y) between the scan line SL and the control line CL. The second low-resistance region C3 of the third active layer ACT3 may be electrically connected to the first electrode 211 of the first organic light-emitting diode OLED1.

The first storage capacitor Cst1 may include at least two electrodes. In an embodiment, the first storage capacitor Cst1 may include a first capacitor electrode CE1 and the second capacitor electrode CE2.

The first capacitor electrode CE1 may be disposed in the same layer as the first to third data lines DL1 to DL3. The first capacitor electrode CE1 may be disposed in the same layer as the first and second driving voltage lines VDLa and VDLb. The first capacitor electrode CE1 may be disposed in the same layer as the first and second common voltage lines VSLa and VSLb.

The second capacitor electrode CE2 may be disposed over the first capacitor electrode CE1 and may overlap the first capacitor electrode CE1.

Detailed structures and materials of the second driving transistor M21 and the third driving transistor M31 are the same as the structure of the first driving transistor M11 described above. The second switching transistor M22 and the third switching transistor M32 are the same as the first switching transistor M12 described above, except that they are connected to the first data line DL1 and the third data line DL3, respectively. Detailed structures and materials of the second sensing transistor M23 and the third sensing transistor M33 are the same as the structure of the first sensing transistor M13 described above. Structures of the second storage capacitor Cst2 and the third storage capacitor Cst3 are the same as the structure of the first storage capacitor Cst1 described above.

A first conductive pattern CP1 may be disposed between the first storage capacitor Cst1 and the first switching transistor M12. A second conductive pattern CP2 may be disposed between the second storage capacitor Cst2 and the second switching transistor M22. A third conductive pattern CP3 may be disposed between the third storage capacitor Cst3 and the third switching transistor M32. The structure and arrangement of the first conductive pattern CP1 described below may apply to the second conductive pattern CP2 and the third conductive pattern CP3 in the same way.

Figure 5:
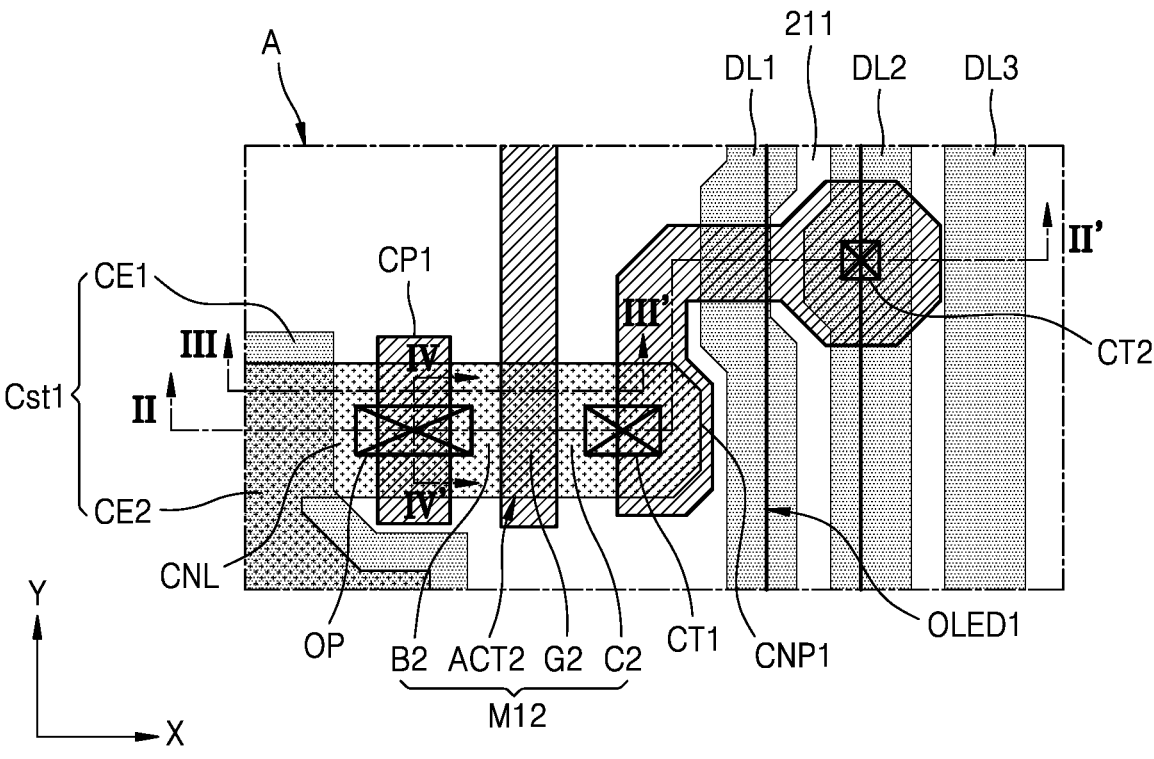
FIG. 5 is an enlarged view of an embodiment of region A of FIG. 4.
Figure 6A:
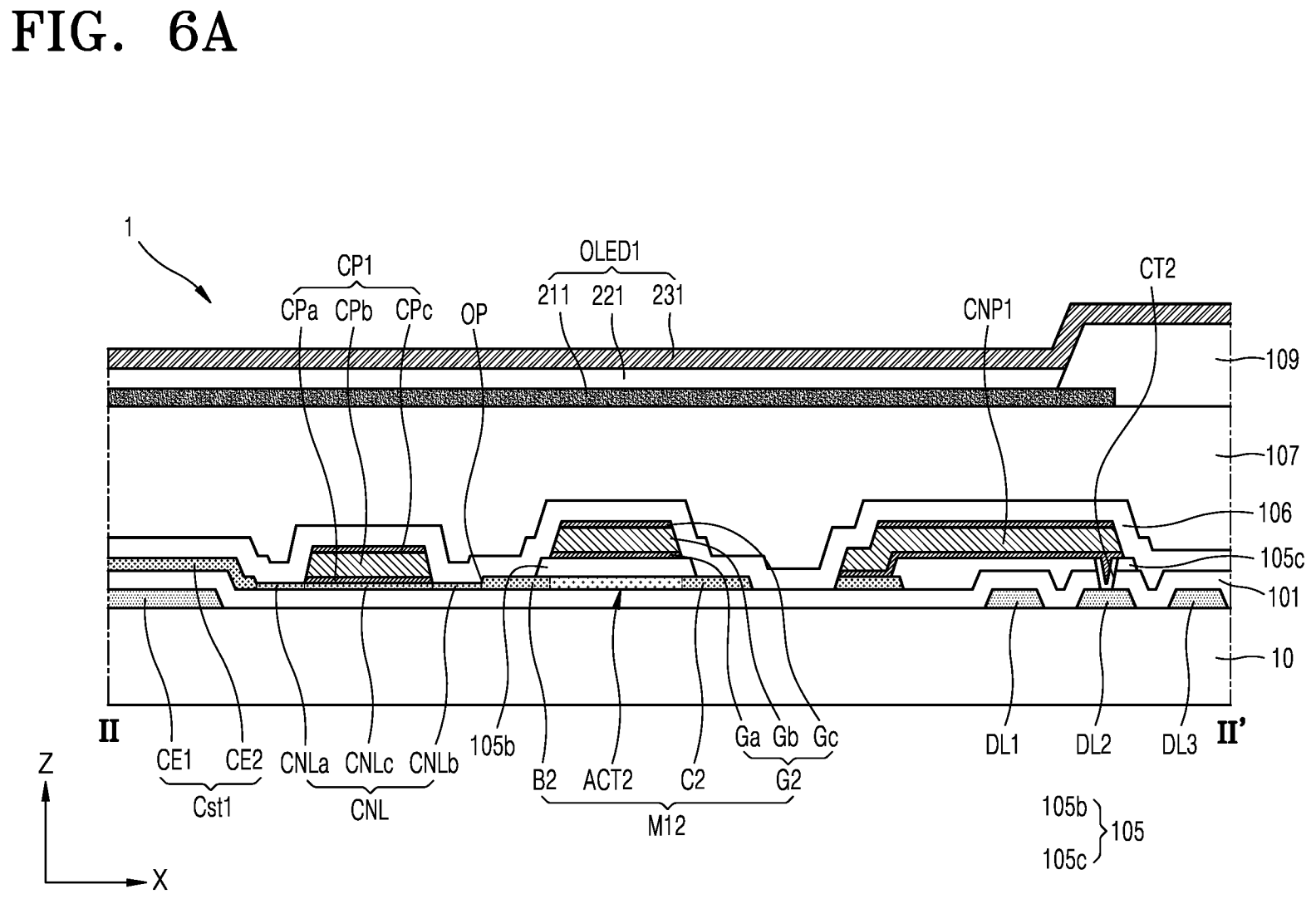
Figure 6B:
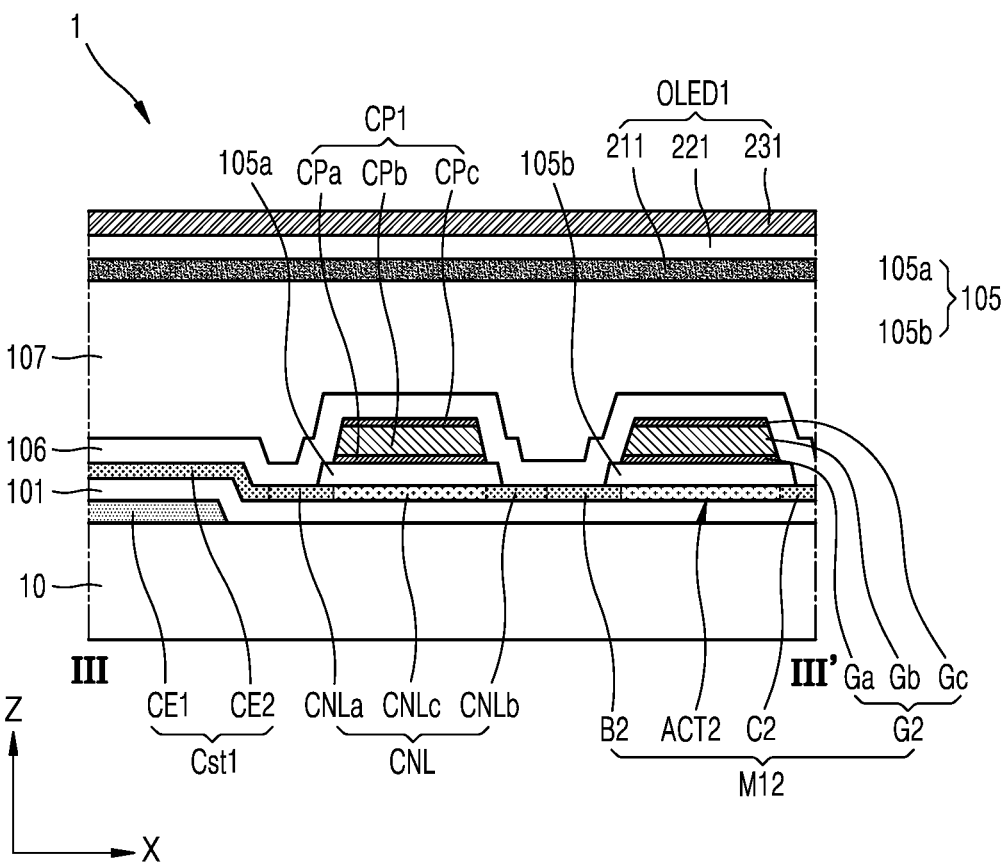
FIG. 6B is a cross-sectional view of region A, taken along line III-III' of FIG. 5.
Figure 6C:
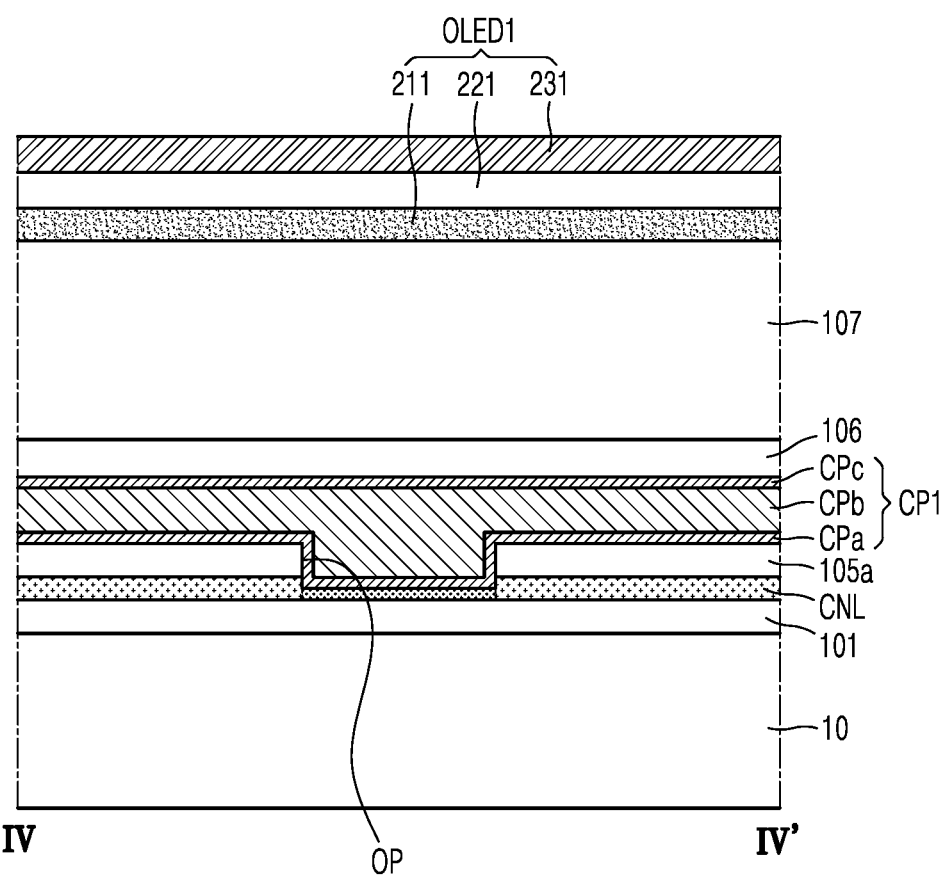
FIG. 6C is a cross-sectional view of region A, taken along line IV-IV' of FIG. 5.

FIG. 5 is an enlarged view of an embodiment of region A of FIG. 4. FIG. 6A is a cross-sectional view of an embodiment of region A, taken along line II-II' of FIG. 5. FIG. 6B is a cross-sectional view of an embodiment of region A, taken along line III-III' of FIG. 5. FIG. 6C is a cross-sectional view of region A, taken along line IV-IV' of FIG. 5.

Referring to FIGS. 5 to 6C, the light-emitting panel 1 may include the first substrate 10, the first storage capacitor Cst1, a lower insulating layer 101, first to third insulating patterns 105a to 105c, the first switching transistor M12, the first conductive pattern CP1, a passivation layer 106, an upper insulating layer 107, and a pixel-defining layer 109. The light-emitting panel 1 may further include the first electrode 211, an emission layer 221, and a second electrode 231.

The first substrate 10 may include a glass material or a resin material. The glass material may include transparent glass mainly including SiO2 The resin material may include polymer resin, such as polyethersulfone, polyacrylate, polyetherimide, polyethylene naphthalate, polyethylene terephthalate, polyphenylene sulfide, polyarylate, polyimide, polycarbonate, cellulose triacetate, cellulose acetate propionate, or any combinations thereof, etc. When the first substrate 10 includes the above-described polymer resin, the first substrate 10 may be flexible, rollable, and bendable. The first substrate 10 may have a single-layer or multi-layer structure including the above material, and the first capacitor electrode CE1, the first to third data lines DL1 to DL3, and the lower insulating layer 101 may be disposed on the first substrate 10. The first capacitor electrode CE1 and the first to third data lines DL1 to DL3 may be disposed below the second active layer ACT2.

The first capacitor electrode CE1 and the first to third data lines DL1 to DL3 may include metal, such as molybdenum (Mo), copper (Cu), titanium (Ti), or any combinations thereof, etc. The first capacitor electrode CE1 and the first to third data lines DL1 to DL3 may be disposed right on the first substrate 10 and may directly contact the first substrate 10, but the disclosure is not limited thereto. In an embodiment, an insulating layer may be disposed between the first capacitor electrode CE1 and the first to third data lines DL1 to DL3 and the first substrate 10, for example.

The lower insulating layer 101 may be disposed on the first substrate 10, and the lower insulating layer 101 may be disposed on the first capacitor electrode CE1 and the first to third data lines DL1 to DL3. The lower insulating layer 101 may include an inorganic insulating material.

An insulating layer 105 including the first insulating pattern 105a, the second insulating pattern 105b, and the third insulating pattern 105c may be disposed over the lower insulating layer 101. The first insulating pattern 105a may be disposed on the connection layer CNL. The second insulating pattern 105b may be disposed on the second active layer ACT2. The second insulating pattern 105b may be disposed between the second active layer ACT2 and the second gate electrode G2. The second insulating pattern 105b may be disposed in a region overlapping the second active layer ACT2. The third insulating pattern 105c may be disposed between the connection pattern CNP1 and the lower insulating layer 101. The insulating layer 105 may include an inorganic insulating material.

As shown in FIG. 6C, an opening OP exposing at least a portion of the connection layer CNL may be defined in the first insulating pattern 105a. The opening OP may be a region defined by removing a portion of the insulating layer 105 in an operation before forming the first conductive pattern CP1, the second gate electrode G2, and the connection pattern CNP1. Accordingly, the connection layer CNL disposed in the opening OP may have a portion removed in an operation of forming the first conductive pattern CP1 and thus may have a vertical thickness less than those of the second capacitor electrode CE2 and the second active layer ACT2. That is, at least a portion of the connection layer CNL contacting the first conductive pattern CP1 may have a vertical thickness less than those of the second capacitor electrode CE2 and the second active layer ACT2. The first insulating pattern 105a may overlap a portion of the first conductive pattern CP1. However, in another embodiment, the entirety of the connection layer CNL disposed in the opening OP may be removed. In this case, a portion of the first conductive pattern CP1 may contact the lower insulating layer 101.

The second capacitor electrode CE2, the connection layer CNL, and the second active layer ACT2 of the first switching transistor M12 may be disposed on the lower insulating layer 101. The second capacitor electrode CE2, the second active layer ACT2, and the connection layer CNL may be arranged in the same layer as one another. The second capacitor electrode CE2, the second active layer ACT2, and the connection layer CNL may be unitary with one another. In this regard, the second capacitor electrode CE2, the second active layer ACT2, and the connection layer CNL being unitary with one another may mean that one pattern includes a portion corresponding to the second capacitor electrode CE2, a portion corresponding to the second active layer ACT2, and a portion corresponding to the connection layer CNL.

The second active layer ACT2 may include an oxide semiconductor material. Although FIGS. 6A to 6C show the second active layer ACT2 including an oxide semiconductor, in some embodiments, the second active layer ACT2 may include amorphous silicon or polysilicon. Hereinafter, an embodiment in which the second active layer ACT2 includes an oxide semiconductor will be described.

The second active layer ACT2 may include oxide of at least one material of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn), for example. In an embodiment, the second active layer ACT2 may be an indium tin zinc oxide ("ITZO") (InSnZnO) semiconductor layer or an indium gallium zinc oxide ("IGZO") (InGaZnO) semiconductor layer, for example.

The second active layer ACT2 may include the first low-resistance region B2 and the second low-resistance region C2, and a channel region may be disposed between the first low-resistance region B2 and the second low-resistance region C2.

The second capacitor electrode CE2 may include the same material as that of the second active layer ACT2. The passivation layer 106 may be disposed on the second capacitor electrode CE2. The insulating layer 105 may not be disposed on the second capacitor electrode CE2. The second capacitor electrode CE2 may be disposed between the lower insulating layer 101 and the passivation layer 106. The second capacitor electrode CE2 may be formed by the same process operation as the second active layer ACT2. The second capacitor electrode CE2 may be made conductive by a subsequent process because the insulating layer 105 is not disposed thereon.

The light-emitting panel 1 may further include the connection layer CNL connecting the second capacitor electrode CE2 and the second active layer ACT2 to each other. The connection layer CNL may be disposed on the lower insulating layer 101.

As shown in FIGS. 6A and 6B, the connection layer CNL may be disposed between the second capacitor electrode CE2 and the second active layer ACT2. The connection layer CNL may include a first portion CNLa between the second capacitor electrode CE2 and the first conductive pattern CP1 and a second portion CNLb between the first conductive pattern CP1 and the first switching transistor M12. The connection layer CNL may include a third portion CNLc between the first portion CNLa and the second portion CNLb, and the third portion CNLc may overlap the first conductive pattern CP1. A portion of the connection layer CNL not overlapping the first insulating pattern 105a may be made conductive by a subsequent process after a process operation of forming the connection layer CNL, the second capacitor electrode CE2, and the second gate electrode G2. In an embodiment, as shown in FIGS. 6A and 6C, the connection layer CNL disposed in the opening OP may be made conductive, for example. In addition, as shown in FIG. 6B, the first portion CNLa and the second portion CNLb of the connection layer CNL arranged in a region outside the opening OP may be made conductive.

The second gate electrode G2 may include at least one of conductive materials including molybdenum (Mo), aluminum (Al), copper (Cu), titanium (Ti), etc., and may have a single-layer or multi-layer structure including the above-described material. The second gate electrode G2 may include a transparent conductive material. The transparent conductive material may include conductive oxide, such as indium tin oxide ("ITO"), indium zinc oxide ("IZO"), zinc oxide (ZnO), indium oxide (In2O3), indium gallium oxide ("IGO"), or aluminum zinc oxide ("AZO").

As shown in FIGS. 6A and 6B, the second gate electrode G2 may have a three-layer structure including a first gate electrode layer Ga, a second gate electrode layer Gb on the first gate electrode layer Ga, and a third gate electrode layer Gc on the second gate electrode layer Gb. In an embodiment, the first gate electrode layer Ga and the second gate electrode layer Gb may include at least one of conductive materials including molybdenum (Mo), aluminum (Al), copper (Cu), titanium (Ti), etc., and the third gate electrode layer Gc may include a transparent conductive material. In an embodiment, the first gate electrode layer Ga may include titanium (Ti), the second gate electrode layer Gb may include copper (Cu), and the third gate electrode layer Gc may include indium tin oxide ("ITO"), for example.

The first conductive pattern CP1 may be disposed between the first storage capacitor Cst1 and the first switching transistor M12. The first conductive pattern CP1 may be disposed between the second capacitor electrode CE2 and the second active layer ACT2. The first conductive pattern CP1 may be disposed between the first storage capacitor Cst1 and the second gate electrode G2. At least a portion of the first conductive pattern CP1 may overlap the connection layer CNL in a direction vertical to a top surface of the first substrate 10, e.g., in the direction z. At least a portion of the first conductive pattern CP1 may be disposed at a vertical level lower than that of the second gate electrode G2. In the description, the vertical level may be defined as a distance from a top surface of the first substrate 10 to a bottom surface of an element. In an embodiment, at least a portion of the first conductive pattern CP1 may be disposed in the opening OP, but the disclosure is not limited thereto. In an embodiment, as shown in FIG. 6C, the first conductive pattern CP1 may have a structure in which a portion thereof is disposed in the opening OP and extends to a region outside the opening OP, for example. In an embodiment, as shown in FIGS. 6A and 6C, a portion of the first conductive pattern CP1 may be connected to the connection layer CNL. A portion of the first conductive pattern CP1 may be disposed between the connection layer CNL and the passivation layer 106. The first conductive pattern CP1 may at least partially contact the first insulating pattern 105a. At least a portion of the first conductive pattern CP1 may be disposed between the first insulating pattern 105a and the passivation layer 106.

The first conductive pattern CP1 may include a conductive material that collects hydrogen. In an embodiment, the first conductive pattern CP1 may include titanium (Ti), etc., for example. The first conductive pattern CP1 may have a single-layer or multi-layer structure. The first conductive pattern CP1 may include the same material as that of at least one layer of the second gate electrode G2. In an embodiment, the first conductive pattern CP1 may have the same stacked structure as the second gate electrode G2. In an embodiment, the first conductive pattern CP1 may include a first layer CPa, a second layer CPb on the first layer CPa, and a third layer CPc on the second layer CPb, for example. The first layer CPa of the first conductive pattern CP1 may include the same material as that of the first gate electrode layer Ga of the second gate electrode G2. In an embodiment, the first layer CPa of the first conductive pattern CP1 and the first gate electrode layer Ga may include titanium (Ti), for example. The second layer CPb of the first conductive pattern CP1 may include the same material as that of the second gate electrode layer Gb of the second gate electrode G2, and the third layer CPc of the first conductive pattern CP1 may include the same material as that of the third gate electrode layer Gc of the second gate electrode G2. The first conductive pattern CP1 may be formed in the same process operation as the second gate electrode G2.

Because the first conductive pattern CP1 includes a conductive material that collects hydrogen, diffusion of hydrogen in a direction from the second capacitor electrode CE2 toward the second gate electrode G2 may be prevented. Accordingly, the hydrogen content of the first portion CNLa of the connection layer CNL may be greater than that of the second portion CNLb. According to embodiments, diffusion of hydrogen into the second gate electrode G2 may be prevented, and thus, electrical reliability may be improved by preventing the second gate electrode G2 from becoming conductive.

Although FIGS. 5 to 6C illustrate the first conductive pattern CP1, the second conductive pattern CP2 of the second pixel circuit PC2 (refer to FIG. 4) and the third conductive pattern CP3 of the third pixel circuit PC3 (refer to FIG. 4) may be arranged in the same layer as and may include the same material as that of the first conductive pattern CP1.

The connection pattern CNP1 may be further disposed on the insulating layer 105. The connection pattern CNP1 may connect the second active layer ACT2 and the second data line DL2 to each other. The connection pattern CNP1 may be connected to the second active layer ACT2 through the first contact hole CT1 in the insulating layer 105 and may be connected to the second data line DL2 through the second contact hole CT2 in the insulating layer 105. The first contact hole CT1 and the second contact hole CT2 may be regions defined by removing a portion of the insulating layer 105 in an operation before forming the first conductive pattern CP1, the second gate electrode G2, and the connection pattern CNP1.

The passivation layer 106 may be disposed over the insulating layer 105 to cover the first conductive pattern CP1, the second gate electrode G2, and the connection pattern CNP1. The passivation layer 106 may be disposed on the first conductive pattern CP1, the second gate electrode G2, and the connection pattern CNP1. The passivation layer 106 may include an inorganic insulating material, such as silicon nitride (SiN$_x$), silicon oxynitride (SION$_x$), any combinations thereof, etc. Hydrogen due to the material included in the passivation layer 106 may diffuse toward the second gate electrode G2 through the second capacitor electrode CE2.

The upper insulating layer 107 may be disposed on the passivation layer 106. The upper insulating layer 107 may include an organic insulating material. In an embodiment, the upper insulating layer 107 may include a general commercial polymer, such as polymethylmethacrylate ("PMMA") or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof, for example.

The first organic light-emitting diode OLED1 may include the first electrode 211, the emission layer 221, and the second electrode 231. The first electrode 211 of the first organic light-emitting diode OLED1 may be disposed on the upper insulating layer 107. The pixel-defining layer 109 in which an opening exposing a portion of the first electrode 211 is defined may be disposed on the first electrode 211, and the emission layer 221 and the second electrode 231 may overlap the first electrode 211 via the opening in the pixel-defining layer 109.

The first electrode 211 may include transparent conductive oxide, such as indium tin oxide ("ITO"), indium zinc oxide ("IZO"), zinc oxide (ZnO), indium oxide (In$_2$O$_3$), indium gallium oxide ("IGO"), or aluminum zinc oxide ("AZO"). In another embodiment, the first electrode 211 may include a reflective layer including magnesium (Mg), silver (Ag), aluminum (Al), platinum (Pt), palladium (Pd), gold (Au), nickel (Ni), neodymium (Nd), iridium (Ir), chromium (Cr), or any combinations thereof. In another embodiment, the first electrode 211 may further include a layer on/under the above-described reflective layer and including or consisting of ITO, IZO, ZnO, or In2O3. In some embodiments, the first electrode 211 may have a three-layer structure of an ITO layer, an Ag layer, and an ITO layer.

Although FIGS. 6A to 6C illustrate the first electrode 211 of the first organic light-emitting diode OLED1, the first electrodes 212 and 213 of the second and third organic light-emitting diodes OLED2 and OLED3 may be arranged in the same layer as and may include the same material as that of the first electrode 211 of the first organic light-emitting diode OLED1.

The emission layer 221 may include a polymer organic material or low-molecular weight organic material emitting blue light. The emission layer 221 may cover the entirety of the first substrate 10. In an embodiment, the emission layer 221 may be formed as one body to cover an entirety of the first to third organic light-emitting diodes OLED1 to OLED3 (of FIG. 4) described with reference to FIG. 4, for example. The second electrode 231 may also cover the entirety of the first substrate 10.

The second electrode 231 may be a semi-transmissive or transmissive electrode. The second electrode 231 may be a semi-transmissive electrode including ultra-thin metal including magnesium (Mg), silver (Ag), aluminum (Al), platinum (Pt), palladium (Pd), gold (Au), nickel (Ni), neodymium (Nd), iridium (Ir), chromium (Cr), or any combinations thereof. In an embodiment, the second electrode 231 may be a semi-transmissive layer having such a structure as an MgAg layer, an AgYb layer, an Yb layer/MgAg layer, or a Li layer/MgAg layer, for example. The second electrode 231 may include transparent conductive oxide, such as indium tin oxide ("ITO"), indium zinc oxide ("IZO"), zinc oxide (ZnO), indium oxide (In$_2$O$_3$), indium gallium oxide ("IGO"), or aluminum zinc oxide ("AZO").

The pixel-defining layer 109 may include an organic insulating material, such as benzocyclobutene ("BCB"), polyimide, or hexamethyldisiloxane ("HMDSO"). In an alternative embodiment, the pixel-defining layer 109 may include an inorganic insulating material, such as silicon nitride (SiN$_x$), silicon oxynitride (SiO$_x$N$_y$) and/or silicon oxide (SiO$_x$). In an alternative embodiment, the pixel-defining layer 109 may include an organic insulating material and an inorganic insulating material. In an embodiment, the pixel-defining layer 109 may include a light-blocking material and may be in black. The light-blocking material may include carbon black, carbon nanotubes, resin or paste including black dye, metal particles (e.g., nickel, aluminum, molybdenum, and alloys thereof), metal oxide particles (e.g., chromium oxide), or metal nitride particles (e.g., chromium nitride). When the pixel-defining layer 109 includes a light-blocking material, reflection of external light by metal structures disposed under the pixel-defining layer 109 may be reduced.

Among reference numerals in the description given below with reference to the drawings, the same reference numerals as those of FIGS. 5 to 6C denote the same or corresponding elements, and accordingly, a description thereof is omitted for convenience, and only the changes therein are described.

Figure 6D:
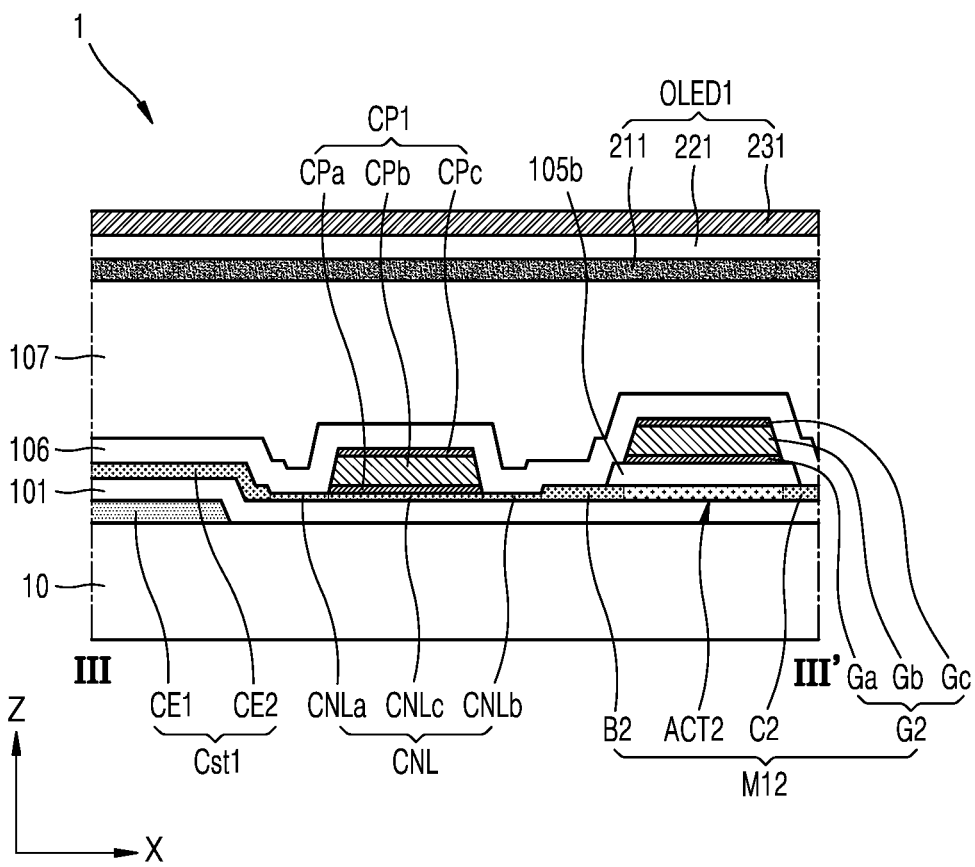
FIG. 6D is a cross-sectional view showing a modified embodiment in a region corresponding to the cross-sectional view of region A, taken along line III-III' of FIG. 5.

FIG. 6D is a cross-sectional view showing a modified embodiment in a region corresponding to the cross-sectional view of region A, taken along line III-III' of FIG. 5.

Referring to FIG. 6D, the first insulating pattern 105*a* may not be disposed under the first conductive pattern CP1. The first insulating pattern 105*a* may not overlap the first conductive pattern CP1. The illustrated embodiment may be applied when a width of the opening OP of FIG. 5 in a direction Y is greater than a width of the connection layer CNL in the direction Y.

The connection layer CNL may be disposed between the second capacitor electrode CE2 and the second active layer ACT2. The connection layer CNL may be disposed on the lower insulating layer 101. The connection layer CNL may be disposed between the first conductive pattern CP1 and the lower insulating layer 101. The connection layer CNL may not overlap the first insulating pattern 105*a*. The first conductive pattern CP1 may be disposed on the connection layer CNL. In the entirety of the region where the connection layer CNL and the first conductive pattern CP1 overlap each other, the connection layer CNL may contact the first conductive pattern CP1.

Figure 7:
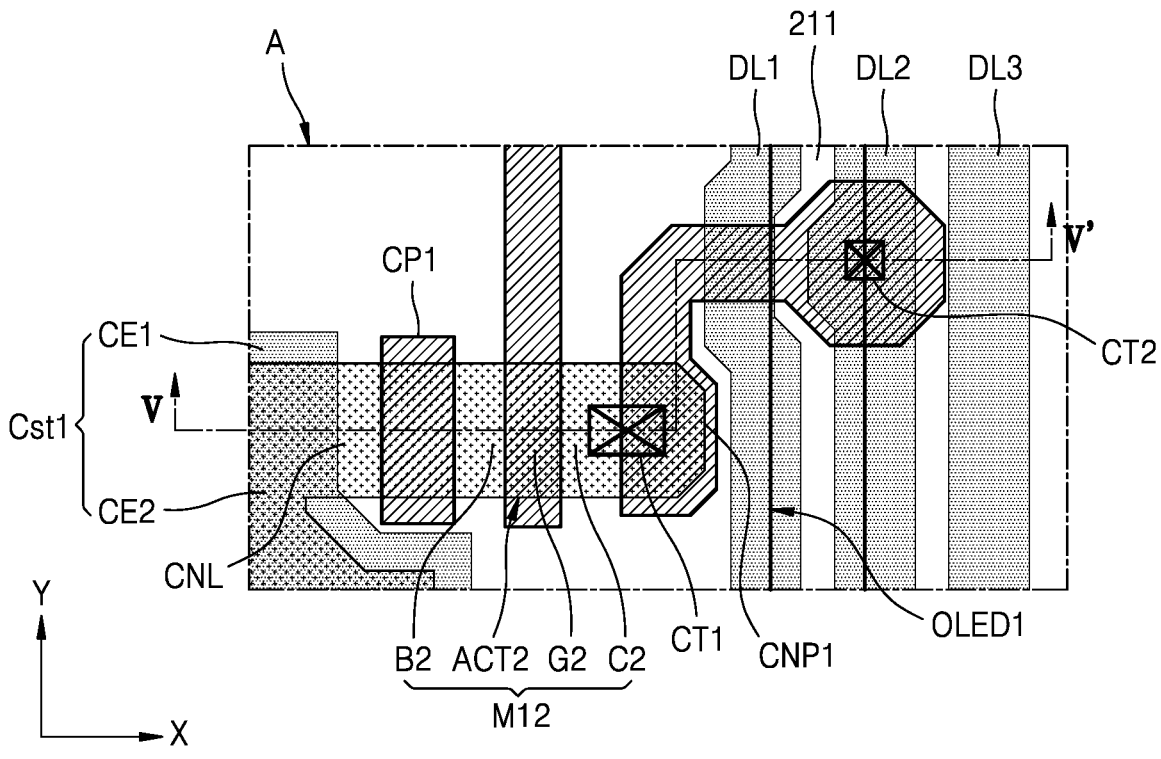
FIG. 7 is an enlarged view of another embodiment of region A of FIG. 4.
Figure 8:
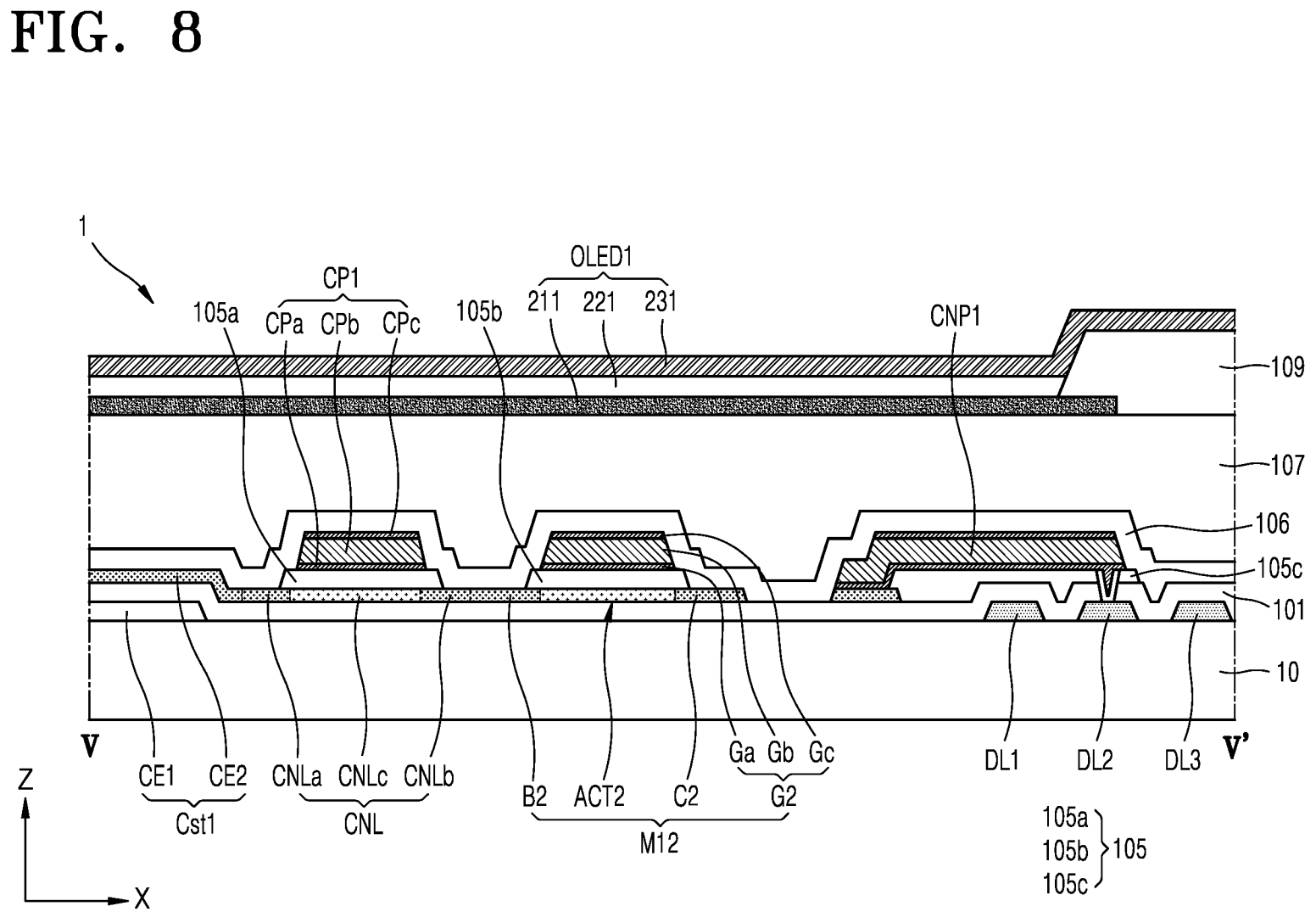

FIG. 7 is an enlarged view of an embodiment of region A of FIG. 4. FIG. 8 is a cross-sectional view of region A, taken along line V-V' of FIG. 7.

Referring to FIGS. 7 and 8, the insulating layer 105 may be disposed on the second active layer ACT2 and the connection layer CNL. The insulating layer 105 may include the first insulating pattern 105*a*, the second insulating pattern 105*b*, and the third insulating pattern 105*c*. The first insulating pattern 105*a* may be disposed between the first conductive pattern CP1 and the connection layer CNL. In the illustrated embodiment, unlike the embodiments of FIGS. 5 to 6C, the opening OP (refer to FIG. 5) may not be defined in the connection layer CNL. In the illustrated embodiment, the connection layer CNL and the first insulating pattern 105*a* may entirely overlap each other.

The second capacitor electrode CE2, the connection layer CNL, and the second active layer ACT2 of the first switching transistor M12 may be disposed on the lower insulating layer 101. The second capacitor electrode CE2, the second active layer ACT2, and the connection layer CNL may be arranged in the same layer as one another. The second capacitor electrode CE2, the second active layer ACT2, and the connection layer CNL may be unitary with one another.

The connection layer CNL may include the same material as that of the second active layer ACT2. The connection layer CNL may be formed in the same process operation as the second active layer ACT2. In the illustrated embodiment, the connection layer CNL may be made conductive in the first portion CNLa and the second portion CNLb not overlapping the first insulating pattern 105*a*, and the third portion CNLc overlapping the first insulating pattern 105*a* may not be made conductive. However, the disclosure is not limited thereto.

The first conductive pattern CP1 may be disposed between the first storage capacitor Cst1 and the first switching transistor M12 to overlap the connection layer CNL. The first conductive pattern CP1 may overlap the connection layer CNL and the first insulating pattern 105*a*. In an embodiment, the first conductive pattern CP1 may be spaced apart from the connection layer CNL by the first insulating pattern 105*a*. In an embodiment, the first conductive pattern CP1 may be electrically floating, but the disclosure is not limited thereto. The first conductive pattern CP1 may be disposed at substantially the same vertical level as that of the second gate electrode G2. The first conductive pattern CP1 may contact the first insulating pattern 105*a*. The first conductive pattern CP1 may be disposed between the first insulating pattern 105*a* and the passivation layer 106.

Even when the first conductive pattern CP1 is disposed on the first insulating pattern 105*a* and thus is apart from the connection layer CNL, the hydrogen content of the first portion CNLa may be greater than that of the second portion CNLb due to a conductive material that collects hydrogen, included in the first conductive pattern CP1.

According to one or more of the embodiments described above, a display device may further include a conductive pattern between a storage capacitor and a thin-film transistor, and thus, electrical reliability of the display device may increase. However, the disclosure is not limited by such an effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display device comprising:
   a transistor comprising:
      an active layer; and
      a gate electrode which overlaps a channel region of the active layer and comprises at least one layer;
   a storage capacitor comprising:
      a first capacitor electrode which is electrically connected to the transistor and disposed below the active layer; and
      a second capacitor electrode over the first capacitor electrode;
   a connection layer connecting the second capacitor electrode and the active layer to each other; and
   a conductive pattern disposed between the storage capacitor and the transistor and comprising a same material as a material of the at least one layer of the gate electrode.

2. The display device of claim 1, wherein the connection layer comprises a first portion between the second capacitor electrode and the conductive pattern and a second portion between the conductive pattern and the transistor, wherein a hydrogen content of the first portion is greater than a hydrogen content of the second portion.

3. The display device of claim 1, wherein the second capacitor electrode, the connection layer, and the active layer are unitary with one another.

4. The display device of claim 1, further comprising an insulating pattern between the connection layer and the conductive pattern.

5. The display device of claim 4, wherein an opening is defined in the insulating pattern between the storage capacitor and the transistor and exposes at least a portion of the connection layer, wherein the conductive pattern contacts the at least the portion of the connection layer exposed by the opening.

6. The display device of claim 5, wherein at least a portion of the conductive pattern is disposed in the opening.

7. The display device of claim 5, wherein the at least the portion of the connection layer in contact with the conductive pattern has a vertical thickness less than a vertical thickness of the second capacitor electrode.

8. The display device of claim 1, wherein at least a portion of the conductive pattern is disposed at a vertical level lower than that of the gate electrode.

9. The display device of claim 4, wherein the conductive pattern is spaced apart from the connection layer by the insulating pattern.

10. The display device of claim 1, wherein at least a portion of the conductive pattern is disposed at a same vertical level as a vertical level of the gate electrode.

11. The display device of claim 1, wherein the conductive pattern has a same stacked structure as a stacked structure of the gate electrode.

12. The display device of claim 1, wherein the gate electrode comprises a first gate electrode layer, a second gate electrode layer on the first gate electrode layer, and a third gate electrode layer on the second gate electrode layer.

13. The display device of claim 12, wherein the conductive pattern comprises a first layer, a second layer on the first layer, and a third layer on the second layer, wherein the first layer of the conductive pattern comprises a same material as a material of the first gate electrode layer.

14. The display device of claim 13, wherein the second gate electrode layer comprises a same material as a material of the second layer of the conductive pattern, and the third gate electrode layer comprises a same material as a material of the third layer of the conductive pattern.

15. The display device of claim 1, wherein the conductive pattern comprises titanium (Ti).

16. The display device of claim 1, further comprising a passivation layer disposed on the gate electrode and the conductive pattern and comprising silicon nitride or silicon oxynitride.

17. The display device of claim 1, wherein the gate electrode receives a scan signal.

18. A display device comprising:

a transistor comprising:

an active layer; and a gate electrode which overlaps a channel region of the active layer;

a storage capacitor comprising:

a first capacitor electrode which is electrically connected to the transistor and disposed below the active layer; and a second capacitor electrode over the first capacitor electrode, a connection layer unitary with the second capacitor electrode and the active layer and connecting the second capacitor electrode and the active layer to each other;

a conductive pattern disposed between the storage capacitor and the transistor and having a same stacked structure as a stacked structure of the gate electrode; and a passivation layer disposed on the gate electrode and the conductive pattern.

19. The display device of claim 18, wherein the connection layer comprises a first portion between the second capacitor electrode and the conductive pattern and a second portion between the conductive pattern and the transistor, wherein a hydrogen content of the first portion is greater than a hydrogen content of the second portion.

20. A display device comprising:

a first driving voltage line and a first common voltage line extending in a first direction on a substrate;

a scan line extending in a second direction crossing the first driving voltage line and the first common voltage line;

a switching transistor comprising an active layer and a gate electrode which overlaps a channel region of the active layer and is connected to the scan line;

a storage capacitor electrically connected to the switching transistor and comprising a first capacitor electrode and a second capacitor electrode; and a conductive pattern disposed between the switching transistor and the storage capacitor.

* * * * *